US006643323B1

(12) United States Patent
Allred

(10) Patent No.: US 6,643,323 B1
(45) Date of Patent: Nov. 4, 2003

(54) DIGITAL FILTERING METHOD

(75) Inventor: Rustin W. Allred, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/496,841

(22) Filed: Feb. 2, 2000

(51) Int. Cl.$^7$ ............................................... H03M 7/30
(52) U.S. Cl. ...................................... 375/229; 708/300
(58) Field of Search ................................. 375/232, 350, 375/233, 234, 229; 708/301, 319, 323; 333/18, 28 R

(56) References Cited

U.S. PATENT DOCUMENTS

| | | | | |
|---|---|---|---|---|
| 4,337,518 A | * | 6/1982 | Ohnishi et al. | 708/320 |
| 5,646,621 A | * | 7/1997 | Cabler et al. | 341/143 |
| 6,289,367 B1 | * | 9/2001 | Allred | 708/277 |

OTHER PUBLICATIONS

"Computation of the Base Two Logarithm of Binary Numbers," IEEE Trans. Electron. Comput., EC–14, pp. 863–867, 1965 (M. Combet, H. Van Zonneveld, and L. Verbeek).

"New Algorighms for the Approximate Evaluation of Hardware of Binary Logarithms and Elementary Functions," IEEE Trans. Comput., C–21, pp. 1416–1421, 1972 (D. Marino).

"A Note an Base–2 Logarithm Computations," IEEE Proc., 61, pp. 1519–1520, 1973 (J.C. Majithia and D. Levan).

"A Class of Algorighms for Ln x, Exp x, Sin x, Cos x, Tan^–1 x and Cot^–1 x," IEEE Trans. Electron. Comput., EC–14, pp. 85–86, 1965 (W. H. Specker).

* cited by examiner

Primary Examiner—Don N. Vo
(74) Attorney, Agent, or Firm—William B. Kempler; W. James Brady, III; Frederick J. Telecky, Jr.

(57) ABSTRACT

A method of implementing a digital filter utilizes a fast and accurate reciprocal estimate function to generate and recharacterize the digital filter on the fly. The reciprocal estimate function operates to synthesize a digital filter rapidly and efficiently without the necessity for trigonometric and/or division capabilities, thereby preserving integrated circuit real-estate.

22 Claims, 2 Drawing Sheets

DIGITAL FILTERING METHOD

RELATED PATENT APPLICATION

This application is related to co-pending U.S. patent application entitled Digital Graphametric Equalizer, filed on Jan. 14, 2000.

BACKGROUND OF THE INVENTION

1. Field of the Invention

This invention relates generally to digital filters, and more particularly to a method of efficiently implementing digital filters on the fly without use of division and/or trigonometric functions.

2. Description of the Prior Art

Digital filters are well known in the art. First and second order allpass digital filters are often used as building blocks to implement equalizers. Some types of equalizers have a fixed number of filters having fixed center frequencies and bandwidths and adjustable gains. Other types of equalizers can have a fixed number of filters wherein each filter has a fixed gain, bandwidth and center frequency. The type of equalizer used is dependent upon the particular application. Parametric equalizers, for example, require implementation of the filters solely necessary to eliminate or correct specific problems such as undesirable variations in frequency characteristics associated with certain loudspeakers.

FIG. 1 depicts a well known equalization filter comprising a second-order allpass filter A(z) and k is the peak gain of the equalization filter. The second-order allpass filter A(z) depicted in FIG. 1 further has the form illustrated in FIG. 2. Useful properties of the filter structures shown in FIGS. 1 and 2, such as the relationships that exist between particular parameters and coefficients, are also well known. Boost filters, for example, are known to exhibit the relationships between multiplier parameter $\beta$ and the bandwidth $\Omega$ shown in equation 1 and between a and the center frequency $\omega_0$ shown in equation 2 below when using such filter structures. Further, cut filters are known to exhibit the relationships between the $\beta$ multiplier parameter, the bandwidth $\Omega$ and the gain k shown in equation 3 below when using such filter structures.

$$\beta = [\tan(\Omega/2) - 1]/[\tan(\Omega/2) + 1] \quad (1)$$

$$\alpha = -\cos(\omega_0) \quad (2)$$

$$\beta = [\tan(\Omega/2) - k]/[\tan(\Omega/2) + k] \quad (3)$$

McGrath, D. S., *A New Approach to Digital Audio Equalization*, 97th AES, November, 1994, discloses combining a graphical user interface to a long finite impulse response (FIR) filter equalizer to give some of the benefits of a parametric equalizer with the controllability of a graphic equalizer. McGrath also states that his approach can be accomplished via infinite impulse response (IIR) filters.

One class of digital filters associated with particular equalizers requires the ability to change the gain k in small increments. This requirement is especially problematic for cut filters since, as seen from equation (3) above, $\beta$ has a dependency on the gain k. While this is not a problem in systems with both trigonometric functions and division capability, it can be complicated to deal with otherwise. Systems having division capability but no trigonometric capability can tabulate and download tangent function values as a filter parameter, since that particular filter parameter is seen to be a constant for each value of bandwidth. The $\beta$ parameter that comprises the tangent function can then efficiently be calculated as necessary using the relationship of equation (4) below.

$$\beta = [(\Phi - k)]/[\Phi + k] \quad (4)$$

Systems having neither division capability nor trigonometric capability often. require utilization of piecewise linearization techniques well known to one of ordinary skill in the art of mathematical modeling techniques, for example, assuming that the bandwidth and gains are known in advance or will be chosen from a small set of possible values. A special class of digital filters, however, requires the ability to compute equation (4) on the fly (in near real time). This special class of filters has neither division nor trigonometric capabilities, but must still be capable of varying the filter characteristics with more flexibility than that achievable when using the above referenced piecewise linearization techniques.

In view of the foregoing, it would be desirable to have a versatile and efficient method of varying digital filter multiplier element parameters or other element parameters that exhibit trigonometric and/or divisional relationships among certain filter input characteristics, including but not necessary limited to, bandwidth, sampling frequency and gain. Such a method of varying these digital filter parameters would allow implementation of a unique class of digital filters in which filtering qualities could be achieved in near real time, even when the aforesaid trigonometric and division capabilities are not available in either hardware or software to aid in the implementation process.

SUMMARY OF THE INVENTION

The present invention is directed to a method of efficiently varying digital parameters on the fly without use of division functions alone or in combination with trigonometric functions. Desired user inputs are passed through a translation function to convert filter characteristics such as center frequency, bandwidth and gain into filter parameters ($\alpha$, $\beta$, k) via equations 1–3 presented above. A general purpose processor such as a DSP, microprocessor, or microcontroller could be coupled with switches, shaft encoders, or a keyboard to perform the foregoing input and translation functions. The present inventive method translates user inputs into filter parameters via a novel fast reciprocal estimate function shown in equation (5) for accurately forming an estimate for the reciprocal of a constant x.

$$1/x \approx (1/s) \ast 2^{-n-2} - r \ast 2^{-2n-1} + 2^{-n-1}; \text{ where} \quad (5)$$

s is a scaling parameter that will ordinarily have a value between 0.5 and 0.6 and is a constant for each application. Therefore the inverse of s can be tabled and applied to avoid computation of its reciprocal. The value of n is represented by the MSD (most significant digit) of the number x, and $r = x - 2^n$.

The present reciprocal estimate function can then be used to quickly, accurately and efficiently vary digital filter parameters such as the multiplier element $\beta$ parameter for particular digital filters such as the allpass-based filters illustrated in FIGS. 1 and 2. Although a general purpose processor such as a DSP, microprocessor, or microcontroller could be coupled with switches, shaft encoders, or a keyboard to perform both the translation and filtering functions, the filtering function itself could just as well be provided via an audio processor such as a member of the TAS3xxx family of devices commercially available from Texas Instruments Incorporated having a place of business in Dallas, Tx.

As used herein, the following words have the following meanings. The words "algorithmic software" mean an algorithmic program used to direct the processing of data by a computer or data processing device. The words "data processing device" as used herein refer to a CPU, DSP, microprocessor, micro-controller, or other like device and an interface system. The interface system provides access to the data processing device such that data could be entered and processed by the data processing device. The words "discrete data" as used herein are interchangeable with "digitized data" and "digitized data" as used herein means data which are stored in the form of singularly isolated, discontinuous data or digits.

Thus, one method of characterizing a digital filter on the fly according to one preferred embodiment will comprise:

providing a predetermined digital filter gain k;

providing a predetermined digital filter bandwidth;

providing a predetermined constant $\Phi$, where $\Phi$ is the tangent of half the bandwidth;

providing a predetermined constant [1/s] where s is selected in the range between about 0.5 to about 0.6;

generating a constant $x=(\Phi+k)$;

generating a constant n having a value determined by the most significant digit of the constant x;

generating a digital filter multiplier parameter $\beta=[\Phi-k]*[1/x]$, using the functional relationship $1/x=(1/s)*2^{2-n-2}-r*2^{-2n-1}+2^{2-n-1}$; where $r=x-2^n$; and implementing a digital allpass filter comprising a multiplier element characterized with the digital multiplier parameter $\beta$.

In one aspect of the invention, a method of generating a digital filter multiplier parameter advances that state of the art associated with digital equalizers by utilizing a simple method for approximating $[\tan(x)-y]/[\tan(x)+y]$ without using trigonometric or division functions, to realize a digital filter.

In still another aspect of the invention, filter parameters are generated on the fly using only addition and/or subtraction functions to characterize a digital filter having adjustable center frequencies and bandwidths.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
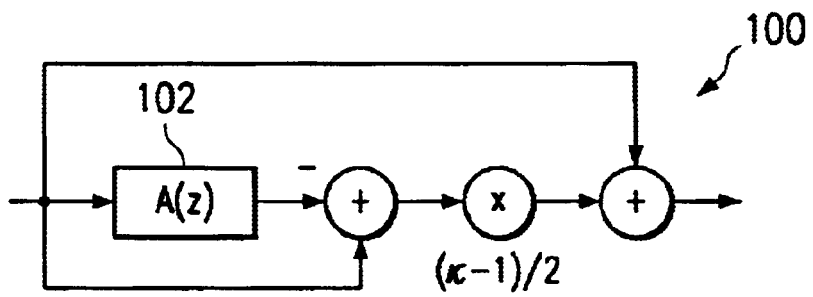
FIG. 1 illustrates a well known digital allpass filter-based equalization filter architecture.

FIG. 1 is a simplified schematic diagram illustrating a well known digital allpass filter-based equalization filter structure 100. Zolzer, U. and Boltze, T., *Parametric Digital Filter Structures*, 99th AES Convention, October, 1995 discloses implementation of second-order equalization filters via the filter structure 100, where A(z) is a second-order allpass filter 102 and k is the peak gain of the filter structure 100. Second-order allpass filters are also well known and can be formulated, for example, using the form illustrated in FIG. 2. Particular relationships between the parameters and the coefficients associated with the allpass filter-based equalization filter structure 100 integrating the second-order allpass filter shown in FIG. 2 exhibit useful properties. Some of these useful properties are exemplified by the equations 1–3 expressed herein above and are repeated below with additional supporting information to further clarify the contributions of the present invention. The following equations portray the relationships between the above referenced parameters and the coefficients, also depicted in FIGS. 1 and 2, when the structure of FIG. 1 is configured as a boost filter (filter having a gain greater than unity). Regarding boost filters, it is known the bandwidth, $\Omega$, affects only $\beta$ and the center frequency, $\omega_0$, affects only $\alpha$.

$$\beta=[\tan(\Omega/2)-1]/[\tan(\Omega/2)+1] \qquad (1)$$

$$\alpha=-\cos(\omega_0) \qquad (2)$$

Further, the gain, k, is applied directly to the filter structure 100 with only a small amount of arithmetic, $(k-1)/2$, as shown in FIG. 1.

The $\beta$ parameter also takes on a dependency with the gain, k, as expressed by equation (3) below, when the filter structure 100 is formulated as a cut filter (gain less than unity).

$$\beta=[\tan(\Omega/2)-k]/[\tan(\Omega/2)+k] \qquad (3)$$

Figure 3:
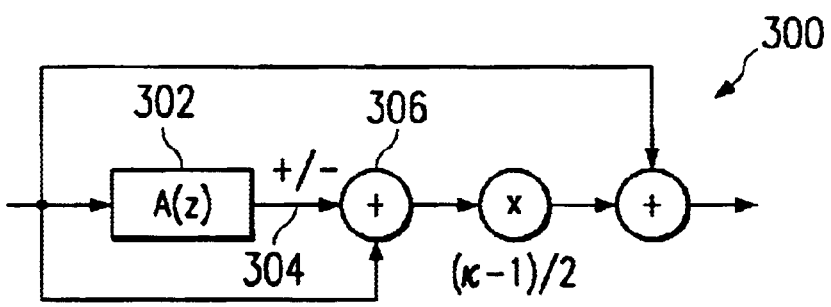
FIG. 3 illustrates a well known digital first-order shelf filters architecture.

FIG. 3 illustrates a well known first-order shelf filter 300. In many audio applications, shelf filters converge toward 0 dB in the center of the audio band, and toward some finite value at the band edge. The A(z) block 302 in FIG. 3 will have the form expressed by equation (6) below.

$$A(z)=[\beta+z^{-1}]/[1+\beta z^{-1}]; \text{ where} \qquad (6)$$

$\beta$ is defined as in equations (1) or (3) expressed herein before. The sign of the branch 304 entering the summing node 306 must be positive for low-frequency (typically 20 Hz to a few hundred Hz) shelves and negative for high frequency (typically above 5 kHz) shelves. The present method can be implemented without use of trigonometric or division functions within the filter structure 300 to allow moveable-corner bass and treble controls on the fly. The sign can be accommodated by downloading a control bit or a multiplicative factor of 1 or –1 while the $\beta$ parameter can be configured to adjust the corner frequencies of the first order shelf filters. Again the values of $\beta$ in the cut region can be approximated using the methods described herein above.

Figure 2:
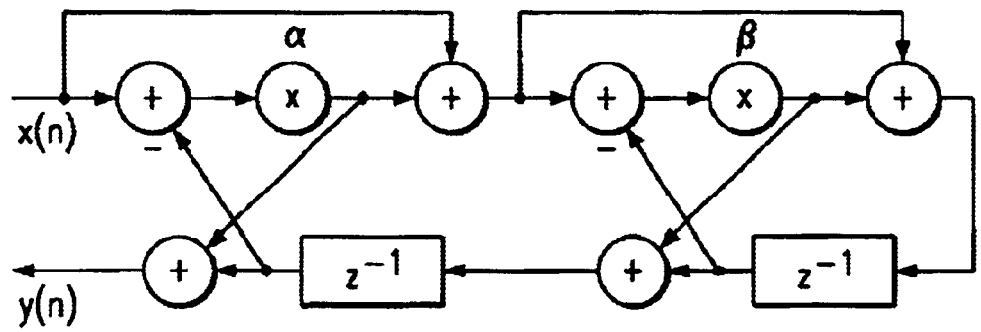
FIG. 2 illustrates a well known digital second-order allpass filter architecture.
Figure 4:
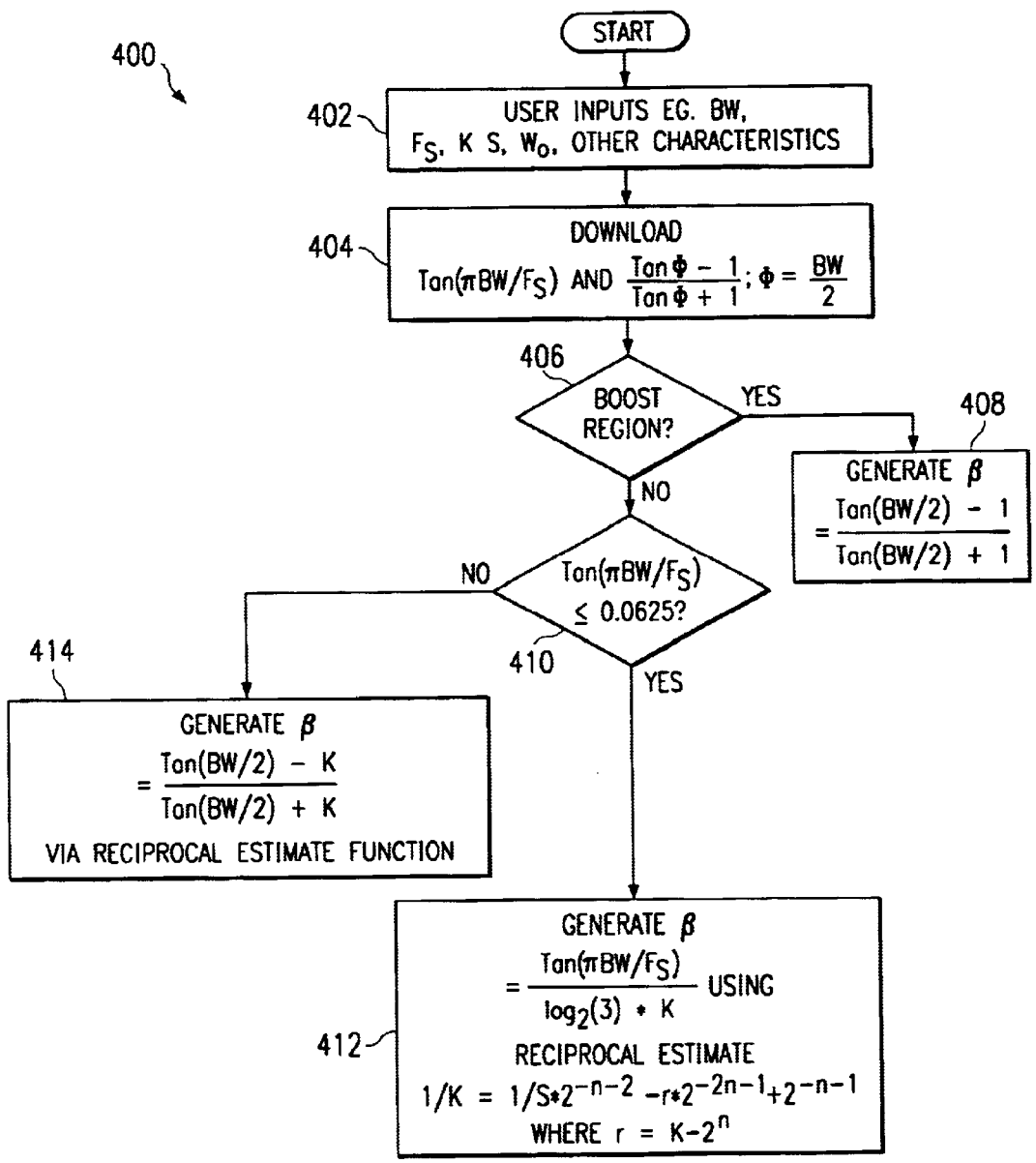
FIG. 4 is a flowchart illustrating one method for generating a filter multiplier element parameter according to one embodiment of the present invention such that the digital filters depicted in FIGS. 1–3 can be recharacterized on the fly without use of trigonometric or division functions.

FIG. 4 illustrates a flowchart 400 illustrating one preferred method for generating a digital filter multiplier element parameter β, among others, according to one embodiment of the present invention such that digital filters, including but not limited to those depicted in FIGS. 1–3, can be implemented and/or recharacterized on the fly without use of division functions either alone or in combination with trigonometric functions. The present invention is not so limited however, and it shall be understood that the present method can be used to quickly and efficiently generate any digital filter element without use of division functions, even when the digital filter element comprises characteristics exhibiting divisional/ratio properties.

Looking again at FIG. 4, requisite predetermined user inputs, e.g. bandwidth BW, sampling frequency $F_s$, gain k, fixed constant 1/s, and center frequency $\omega_0$, are first input to a host device such as a microcomputer, microprocessor or microcontroller as illustrated in block 402. A particular user input, of course, is dependent upon the type of digital filter, application and type of filter element being implemented or recharacterized. Thus, although the instant example depicts generation of a digital filter multiplier β parameter, any other digital filter element parameter that can be reduced to a constant at each frequency of interest can be realized using the present method. Following entry of appropriate predetermined user inputs, a β parameter suitable for use with the digital filters illustrated in FIGS. 1–3 for example, can be determined on the fly by first downloading both $\tan(\pi BW/F_s)$ and the digital boost filter multiplier β parameter from equation (1) from the host device as shown in block 404. $\tan(\pi BW/F_s)$ is downloaded since it is used in the approximations for β in the cut region discussed above with reference to equation (3). The β parameter from equation (1) can also be approximated simply to generate a more accurate value, but for the small cost of the additional download that is a tradeoff between accuracy and cost. The predetermined user input defined as a fixed constant 1/s has a value that is dependent upon a particular application and is downloaded using a small value for s in the range between about 0.5 to about 0.6 for the present method. A fixed value for s in the range of 0.54 to 0.585 was found to improve the accuracy of equation (4) beyond that achievable using previous linearization methods. As illustrated in block 406, a determination is made as to whether a filter element will be used in a cut region or a boost region. Regarding a multiplier element β parameter to be applied in a boost region, the requisite parameter can simply be recalled from a memory location represented by block 408 since it was already downloaded into a memory location as depicted in block 404. Regarding a multiplier element β parameter to be applied in a cut region, a comparison is next made, as shown in block 410, to determine if $\tan(\pi BW/F_s) \leq 0.0625$; and if it is, then use equation (7) below to approximate β by first using equation (5) to estimate the reciprocal of k via the present inventive reciprocal estimate function, which is then multiplied by the numerator of equation (7) along with the tabled or encoded value of the reciprocal of $\log_2(3)$, as shown in block 412. Otherwise, the multiplier element v parameter is determined in the cut region using equation (3) along with the present inventive reciprocal estimate function.

$$\beta \approx \tan(\pi BW/F_s)/\log_2(3) \cdot k; \text{ where} \quad (7)$$

the inverse of the $\log_2(3)$ is a constant that can be tabled or approximated using a canonical sign digit (CSD) representation. Thus, when $\tan(\pi BW/F_s) > 0.0625$, approximate equation (3) in the cut region by first using equation (5) to approximate the reciprocal of the denominator and by then multiplying that approximation by the numerator at each frequency of interest as shown in block 414.

Equation (5) discussed in detail above, is stored or downloaded as an algorithmic software prior to generation of any desired filter element parameter to accurately and timely accommodate on the fly implementation and/or recharacterization of a digital filter(s) or particular digital filter element (s) according to the present method. A further detailed discussion of equation (5) is now presented below to provide those skilled in the art with sufficient information to practice the present invention. Consider for example, a binary word represented by x=01011001. As defined herein, the MSD of x is then determined by counting from zero (from the least significant bit on the right) until the MSD (the location of the first '1' digit of x counting from the left) is reached. The value of n represented by the MSD of the number 01011001 is then 6. U.S. patent application Ser. No. 09/192,981, filed Nov. 16, 1998 by Allred, entitled Digital Signal Processing Circuits, Systems, And Methods Implementing Approximations For Logarithm And Inverse Logarithm, sets forth details of the specific methodology used to determine the MSD. The '981 patent application is assigned to Texas Instruments Incorporated, the assignee of the present invention, and is incorporated by reference herein.

The present method then, represents a significant advancement in the state of digital filter realization generation and recharacterization. Known methods of creating digital filters that use particular reciprocal approximation techniques or piecewise linear approximation techniques, for example, either do not provide the requisite accuracy or the requisite speed, or require more implementation resources than the method of the present invention. Although alternate methods do exist that can accommodate accurate and timely generation and recharacterization of particular digital filter element parameters, these known methods require trigonometric and/or division capability that adds undesirable costs and requires additional wafer real estate, making those methods non-competitive in the present marketplace.

This invention has been described in considerable detail in order to provide those skilled in the equalizer art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular digital filter element characteristics, the present inventive methods are not limited to a particular characteristic or characteristics as used herein. Depending upon the particular application, a characteristic can mean a single characteristic or any combination of filter element characteristics. Thus, a characteristic can be a filter gain k, a filter bandwidth Ω, a filter center frequency $\omega_0$, a sampling frequency Fs, or any combination of such characteristics, among others.

What is claimed is:

1. A method of implementing a digital filter comprising the steps of:

(a) providing a first digital filter characteristic having a value x that comprises a denominator portion for a filter function having a numerator portion and a denominator portion, wherein the filter function is associated with a digital filter element parameter;

(b) providing a predetermined constant s having a numerical value between about 0.5 and about 0.6;

(c) generating a constant n having a value determined by the position of the most significant bit of a binary number representation of the value of x;

(d) generating a reciprocal estimate for x using the functional relationship represented by: $1/x=(1/s)*2^{-n-2}-(x-2^n)*2^{-2n-1}+2^{-n-1}$;

(e) generating a digital filter element parameter via multiplying the reciprocal estimate for x by a numerical value of the numerator portion of the filter function; and (f) characterizing a digital filter element via the generated element parameter to implement the digital filter.

2. The method according to claim 1 wherein the step of providing a first digital filter characteristic comprises providing a predetermined gain k.

3. The method according to claim 2 wherein the step of providing a first digital filter characteristic further comprises providing a constant y such that a value for the gain k can be combined with a value for the constant y to have the value x.

4. The method according to claim 1 wherein the step of providing a first digital filter characteristic comprises providing a predetermined bandwidth $\Omega$.

5. The method according to claim 4 wherein the step of providing a first digital filter characteristic further comprises providing a constant y such that a value associated with $\Omega$ can be combined with a value for the constant y to have the value x.

6. The method according to claim 1 wherein the step of providing a first digital filter characteristic comprises providing a predetermined gain k and a predetermined bandwidth $\Omega$ such that a value associated with the gain k can be combined with a value associated with the bandwidth to have the value x.

7. The method according to claim 1 further comprising the step of providing a new first digital filter characteristic and repeating steps (b)–(f) to recharacterize the digital filter with a new filter element.

8. A method of generating a digital filter comprising the steps of:

(a) providing a first digital filter characteristic comprising one portion of a denominator portion for a filter function having a numerator portion and a denominator portion, wherein the filter function is associated with a digital filter element parameter;

(b) providing a second digital filter characteristic comprising another portion of the denominator portion for the filter function;

(c) generating a value x by summing a value associated with the second digital filter characteristic and a value associated with the first digital filter characteristic;

(d) providing a predetermined constant s having a numerical value between about 0.5 and about 0.6;

(e) generating a constant n having a value determined by the position of the most significant bit of a binary number representation of the value of x;

(f) generating a reciprocal estimate for x using the functional relationship represented by: $1/x=(1/s)*2^{-n-2}-(x-2^n)*2^{-2n-1}+2^{-n-1}$;

(g) generating a digital filter element parameter via multiplying the reciprocal estimate for x by a numerical value of the numerator portion of the filter function; and (h) characterizing the digital filter element via the generated element parameter to implement the digital filter.

9. The method according to claim 8 wherein the step of providing a first digital filter characteristic comprises the step of providing a predetermined gain k.

10. The method according to claim 9 wherein the step of providing a second digital filter characteristic comprises the step of providing a predetermined bandwidth $\Omega$.

11. The method according to claim 9 wherein the step of providing a second digital filter characteristic comprises the step of providing a predetermined fixed constant.

12. The method according to claim 8 further comprising the step of providing a new first digital filter characteristic and repeating steps (b)–(h) to recharacterize the digital filter with a new filter element.

13. The method according to claim 8 further comprising the step of providing a new second filter characteristic and repeating steps (a) and (c)–(h) to recharacterize the digital filter with a new filter element.

14. A method of generating a digital filter comprising the steps of:

(a) providing at least one digital filter characteristic comprising at least one portion of a numerator portion for a filter function having a numerator portion and a denominator portion, wherein the filter function is associated with a digital filter element parameter;

(b) providing at least one digital filter characteristic comprising at least one portion of a denominator portion of the filter function;

(c) generating a value x associated with the at least one digital filter characteristic comprising at least one portion of the denominator portion of the filter function;

(d) providing a predetermined constant s having a numerical value between about 0.5 and about 0.6;

(e) generating a constant n having a value determined by the position of the most significant bit of a binary number representation of the value of x;

(f) generating a reciprocal estimate for x using the functional relationship represented by: $1/x=(1/s)*2^{-n-2}-(x-2^n)*2^{-2n-1}+2^{-n-1}$;

(g) generating a digital filter element parameter via multiplying the reciprocal estimate for x by a numerical value of the numerator portion of the filter function; and (h) characterizing the digital filter element via the generated element parameter to implement the digital filter.

15. The method according to claim 14 wherein the step of providing at least one digital filter characteristic comprising at least one portion of a numerator portion for a filter function comprises the step of providing a predetermined gain k.

16. The method according to claim 14 wherein the step of providing at least one digital filter characteristic comprising at least one portion of a numerator portion for a filter function comprises the step of providing a predetermined bandwidth $\Omega$.

17. The method according to claim 16 wherein the step of providing at least one digital filter characteristic comprising at least one portion of a numerator portion for a filter function further comprises the step of providing a predetermined sampling frequency $F_s$.

18. The method according to claim 14 wherein the step of providing at least one digital filter characteristic comprising at least one portion of a denominator portion of the filter function comprises the step of providing a predetermined gain k.

19. The method according to claim 14 wherein the step of providing at least one digital filter characteristic comprising at least one portion of a denominator portion of the filter function comprises the step of providing a predetermined bandwidth K.

20. The method according to claim 14 wherein the step of providing at least one digital filter characteristic comprising at least one portion of a denominator portion of the filter function comprises the step of providing a predetermined fixed constant defined by $\log_2(3)$.

21. The method according to claim 14 further comprising the step of providing a new at least one digital filter characteristic comprising at least one portion of a numerator portion for a filter function and repeating steps (b)–(h) to recharacterize the digital filter with a new filter element.

22. The method according to claim 14 further comprising the step of providing a new at least one digital filter characteristic comprising at least one portion of the denominator portion for a filter function and repeating steps (a) and (c)–(h) to recharacterize the digital filter with a new filter element.

* * * * *